United States Patent [19]
Larsen et al.

[11] Patent Number: 5,583,380
[45] Date of Patent: Dec. 10, 1996

[54] INTEGRATED CIRCUIT CONTACTS WITH SECURED STRINGERS

[75] Inventors: Bradley J. Larsen, Woodland Park; Kurt Schertenleib, Colorado Springs, both of Colo.

[73] Assignee: Atmel Corporation, San Jose, Calif.

[21] Appl. No.: 501,503

[22] Filed: Jul. 11, 1995

[51] Int. Cl.$^6$ .......................... H01L 23/48; H01L 23/52; H01L 29/40

[52] U.S. Cl. .......................... 257/774; 257/690; 257/773; 257/775

[58] Field of Search .................................. 257/309, 315, 257/690, 758, 759, 773, 774, 775

[56] References Cited

U.S. PATENT DOCUMENTS 5,480,820  1/1996  Roth et al. .............................. 257/315

*Primary Examiner*—Carl Whitehead, Jr.
*Attorney, Agent, or Firm*—Thomas Schneck

[57] ABSTRACT

A contact of large dimensions having a stringer strongly adhered to a contact hole's sidewalls. The contact hole is made to have a patterned perimeter having grooves protruding outward. The grooves have a size equal to a minimum contact dimension in at least one direction so as to ensure good step coverage into the groove areas. The grooves serve to anchor the stringer to the contact hole sidewalls by increasing the sidewall's surface area which increases adhesion, distributing stress from the stringer to the groove areas, and providing grooves with good step coverage.

20 Claims, 5 Drawing Sheets

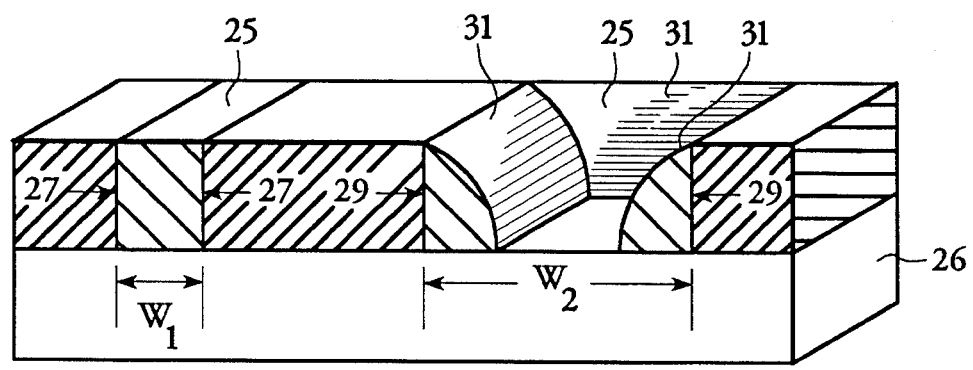
FIG. 11
(PRIOR ART)
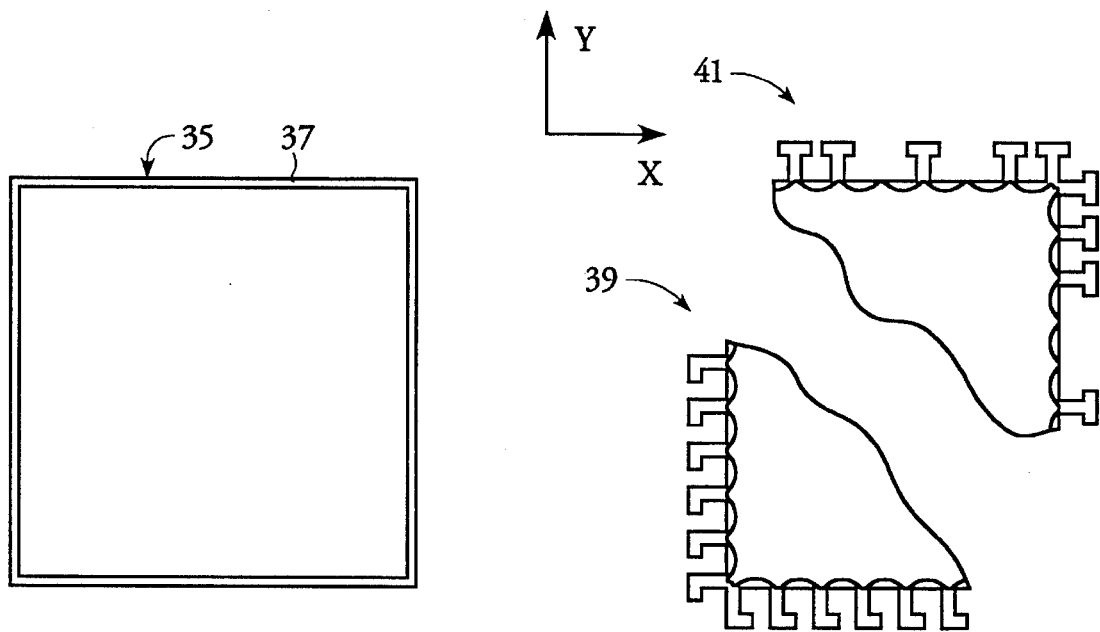
FIG. 12
(PRIOR ART)
FIG. 16

INTEGRATED CIRCUIT CONTACTS WITH SECURED STRINGERS

TECHNICAL FIELD

The invention relates to the structure of integrated circuit contacts and, in particular, those of relatively large dimensions.

BACKGROUND ART

Silicon integrated circuits consists of active device regions constructed within a silicon substrate and isolated from each other by an insulator surrounding the active areas and disposed over the silicon substrate. The isolated devices are interconnected by means of conductive film traces fabricated above the insulator to form electric circuits. The isolated active devices are joined from the substrate to the conductive film traces by contacts.

This may be seen in FIG. 1 where a transistor schematic of an CMOS inverter is shown to have an NMOS enhancement mode transistor 59, a PMOS enhancement mode transistor 57 and four conductive traces; reference ground trace Vss 51, power source trace Vcc 55, input signal trace IN 53, and output signal trace OUT 60. Both transistors are coupled to input signal 53 at their respective gates. Power source Vcc 55 is connected to the source electrode of PMOS transistor 57 at contact point 64, and reference ground Vss 51 is connected to the source electrode of NMOS transistor 59 at contact point 61. Both NMOS transistor 59 and PMOS transistor 57 are connected to output signal OUT 60 at contact points 62 and 63, respectively. The contact points 61–64 serve to electrically couple the individual conductive traces and active region transistors to form an inverter circuit.

In FIG. 2, NMOS transistor 59 is shown to consist of n-type electrodes 67 divided by gate input signal IN 53 and constructed within a p-well 65. The source electrode of NMOS transistor 59 is connected to Vss 51 along contact 61, while its drain electrode is connected to signal OUT 60 by means of contact 62. Similarly, PMOS transistor 57 is constructed within an N-well 69 and consists of p-type electrodes 71 divided by the same gate input signal IN 53. The source electrode of PMOS transistor 57 is connected to Vcc 55 along contact 64 and connected to output signal OUT 60 along contact 63.

With reference to FIG. 3, NMOS transistor 59 and PMOS transistor 57 are defined in terms of film layers to form active areas within a P-substrate 70. NMOS transistor 59 consists of n-type source electrode 67a and n-type drain electrode 67b divided by input gate 53 and constructed within p-well 65. PMOS transistor 57 is constructed within n-well 69 and consists of a p-type source electrode 71b and p-type drain electrode 71a divided by input gate electrode 53. PMOS transistor 57 and NMOS transistor 59 are isolated from each other by field oxide 75, and both have a thin layer of silicide 77 on their drain, gate and source electrode for the purpose of reducing contact resistance. A layer of silicon dioxide insulator 73 covers and further isolates both transistors 59 and 57.

Using a masking step, vias, or contact holes, 72 are made in the silicon dioxide 73 penetrating from its surface to each electrode 67 and 71 of transistors 59 and 57, respectfully, as shown in FIG. 4. Although vias having an inclined slope provide for good step coverage, vertical vias 72 are shown since reduced contact size has become an important factor in advanced lithographic patterning technologies. A conductor, such as CVD tungsten 79, is then blanketed over the silicon dioxide 73. Tungsten 79 is used since it serves as both a good contact barrier between metals such as aluminum used to construct conductive film traces and the silicon electrodes 67 and 71, and also serves as a good interconnect fill for improving step coverage of the metal.

The tungsten 79 is then etched back to form a level surface with the silicon dioxide 73, as shown in FIG. 5. The tungsten 79, surrounded by silicon dioxide 73, forms contacts 61–64, as represented in FIGS. 1 and 2. Finally, a metal such as aluminum is used to form three conductive film traces 51, 60, and 55 laid over the contacts 61–64 to form lines Vss, OUT, and Vcc, respectfully, as depicted in FIGS. 1 and 2.

With reference to FIG. 7, a close-up view of the construction of a semiconductor contact shows a layer of silicon dioxide insulator 13 disposed over a silicon substrate body 12 with a vertical contact hole 11 made within the silicon dioxide insulator 13. CVD tungsten 15 is blanketed over the silicon dioxide insulator 13 and within the contact hole cavity 15. The tungsten 17 is then etched back to leave only the via, or contact, 19, shown in FIG. 8.

It is important to have good interconnect step coverage into a contact hole such that the tungsten sufficiently covers the sidewalls of the contact window and forms a relatively level surface with the surrounding silicon dioxide insulator. Otherwise, the contact may form a poor conductive path to an active device region, or irregularities on the surface of the contact may be amplified in subsequent process film layer steps, resulting in low component yields. The contact should therefore be small enough to allow a complete contact fill after the tungsten is etched back. As a result, a layout requirement is that all contacts be of a minimum dimension in at least one direction, as shown in FIG. 9. In FIG. 9, a top view of contacts 21 and 23 shows them to have respective widths, w and W, of equal size, but respective lengths l and L of different size. The width is set to a common minimum that assures good step coverage.

FIG. 10 shows a three dimensional view of a cut-out portion of two contact holes 27 and 29 of different widths W1 and W2, respectively, formed on a silicon substrate 26 and covered by a layer of tungsten 25. After etching back the tungsten 25, shown in FIG. 11, the tungsten 25 in the contact of smaller width W1 is shown to completely cover the sidewalls of the contact hole 27, providing a good interconnect step coverage. In the contact of larger width W2, however, the etching back of the tungsten 25 is shown to form residue stringers 31 along the sidewalls of contact hole 29. Therefore, if a contact of relatively large dimensions, having at least one physical dimension of a few microns or more, is constructed using prior art methods, as shown in FIG. 12, long tungsten stringers 37 will develop along the perimeter of the contact hole sidewalls 35. Because of the differences in film stress, the tungsten stringers 37 may, in whole or part, separate and lift from the sidewalls 35 and be redeposited elsewhere on a wafer surface, causing a defective device.

As a result, only minimum sized contacts are usually used in silicon integrated circuits, with larger contacts constructed as multiple contact windows placed side by side. This provides for the smallest device size possible since the minimum sized contact is commonly determined by the minimum resolution capability of a patterning technology used in the integrated circuit in which the contact is constructed, which is usually in the sub-micron range.

Laying out a circuit using only minimum dimension contacts is normally not a problem. However, the layout of certain test structures, process monitor features, and photo processing aids cannot be done using only minimum dimension contacts. For example, it may happen that a contact etch process monitor has a spot size component greater than the minimum contact size. Further, some photo alignment tools require large dimension features to be printed on wafer to accomplish alignment. Still other aligning tools require resist to be cleared over a previously printed alignment key. This is done by removing the resist in a large area over that alignment key. Additionally, if the process flow contains a "plug" implant into the contact, it is common to provide for a spreading resistance structure to monitor the implant profile. Spreading resistance structures requires a feature larger than a hundred microns to measure.

If these large contact geometries are contained on a photo mask, or wafer, the resultant previously described stringer may lift off of contact window sidewalls causing defect problems.

It is an object of this invention to provide a contact structure of large dimensions which reduces the separating and lifting off of stringers from contact window sidewalls.

DISCLOSURE OF INVENTION

The above object has been met in a contact structure of large dimensions which increases adhesion of a stringer to a contact Window sidewall while reducing stress on the stringer. Unlike large contacts of prior art whose perimeter is constructed as smooth uninterrupted straight lines, large contacts in accord with the present invention incorporate grooved protrusions that extend outwardly from the sidewall forming a patterned perimeter. The patterned perimeter forms a contour similar to the contour of a battlement, commonly associated with the walls of medieval fortresses. The grooved pattern serves to anchor the stringer to the sidewall by increasing the sidewall's surface area and thereby increasing adhesion of the stringer to the sidewall. Further, the grooved pattern gives the stringer outward protruding members which help to dampen any applied stress to the main stringer-body.

To further reduce separation and lifting off of a stringer from a contact window sidewall, the grooved pattern is made to have a minimum dimension, preferably 0.2 μm to 1.0 μm, in at least one lateral direction. However, the minimum dimension is generally defined to be the minimum dimension allowable by the lithographic technology used in the patterning of film layers for the construction of an integrated circuit in which the contact is used. Contacts which incorporate such minimum dimension groove patterns increase the step coverage into the grooved pattern of the contact window and thereby also increase the adhesion of a stringer to a contact hole sidewall. This enhances the groove pattern's ability to anchor the stringer to the contact window sidewall.

BRIEF DESCRIPTION OF THE DRAWINGS

FIG. 11 is perspective view of the resultant contacts formed by means of the process step shown in FIG. 10.

FIG. 12 is a prior art top view of a large contact hole with residue stringers laid along its perimeter sidewalls.

FIG. 16 is a top view of two large contact in accord with the present invention.

BEST MODE OF CARRYING OUT THE INVENTION

Figure 1:
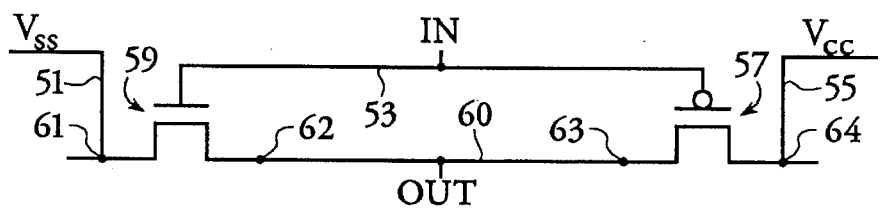
FIG. 1 is a schematic drawing of a CMOS inverter circuit of the prior art.
Figure 2:
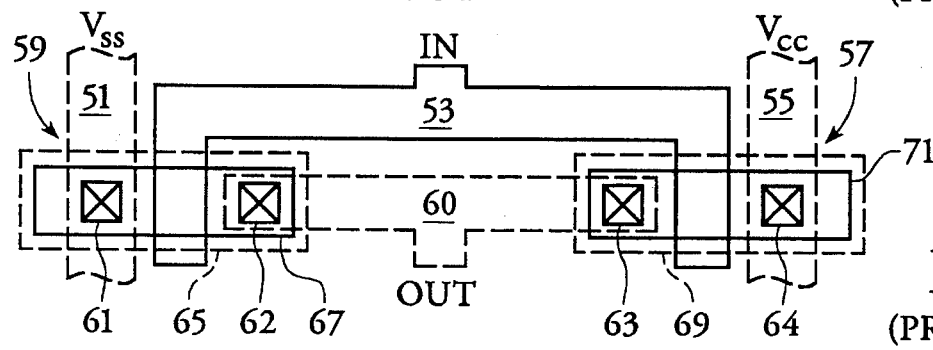
FIG. 2 is a top plan layout of the schematic drawing of FIG. 1.
Figure 3:
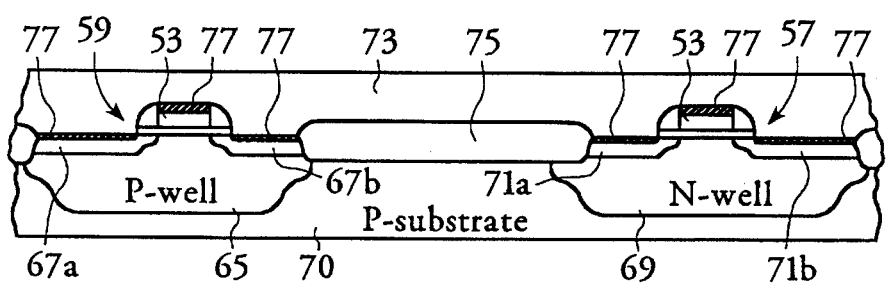
FIGS. 3–6 show prior art methods of constructing contacts at the silicon level to form the CMOS inverter of FIG. 1.
Figure 4:
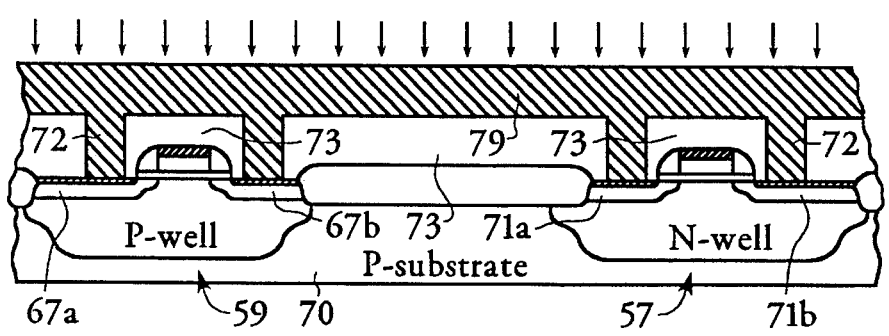
Figure 5:
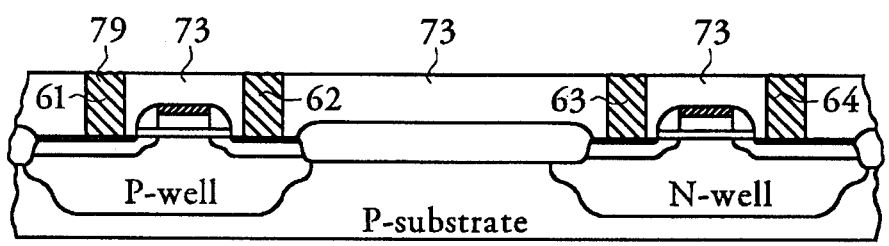
Figure 6:
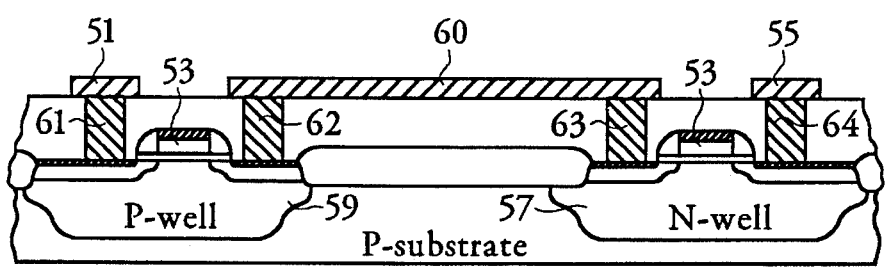
Figure 7:
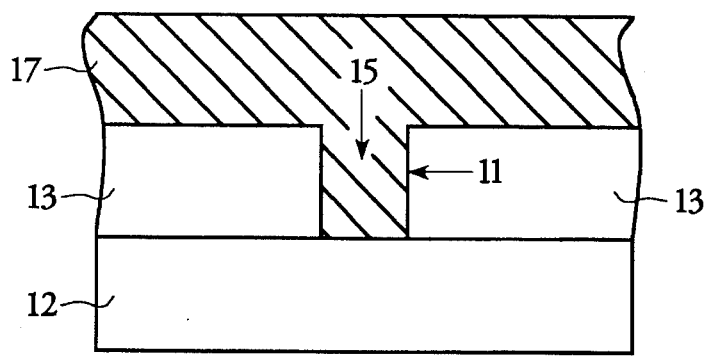
FIGS. 7–9 illustrate prior art methods of constructing contacts.
Figure 8:
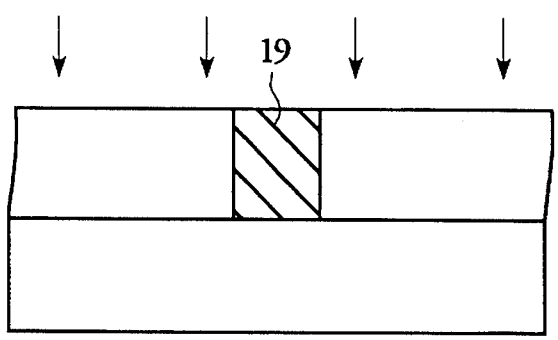
Figure 9:
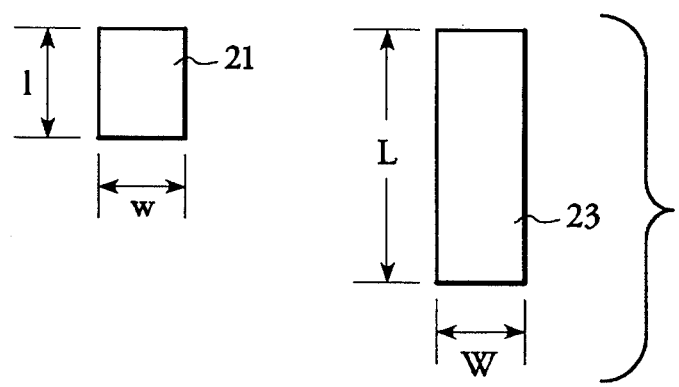
Figure 10:
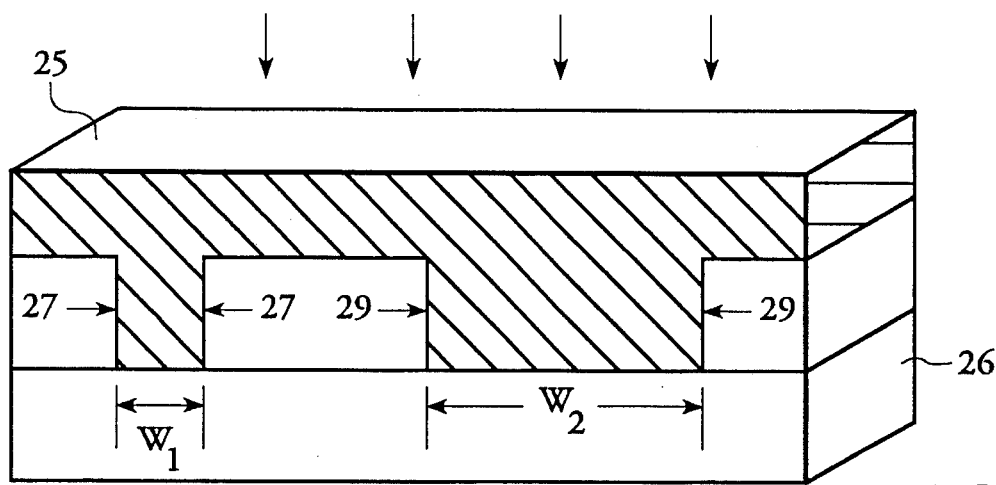
FIG. 10 is a prior art perspective representation of a process step in the construction of two contacts of different widths.
Figure 13:
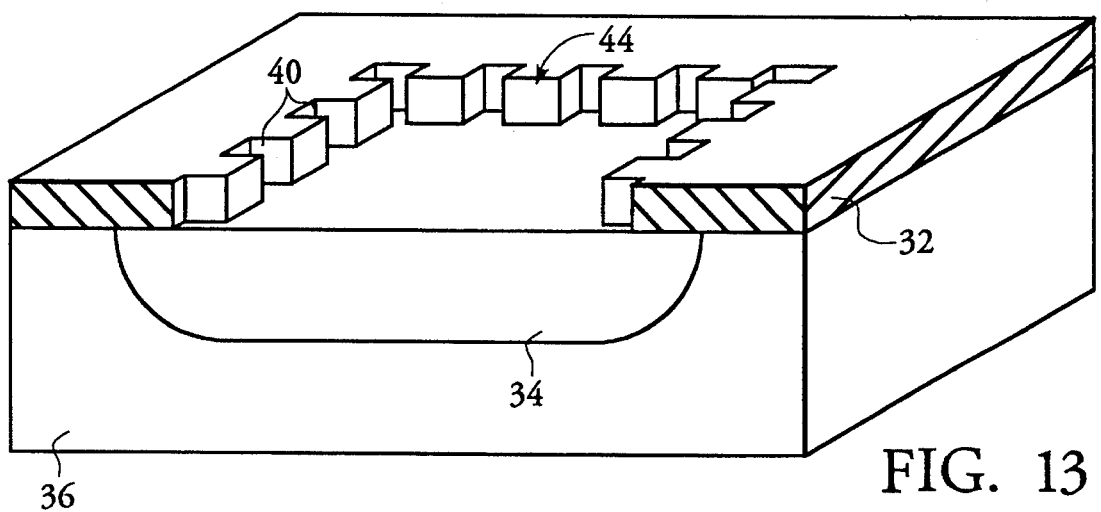
FIG. 13 is a perspective view of a large contact hole for construction of a contact in accord with the present invention.
Figure 14:
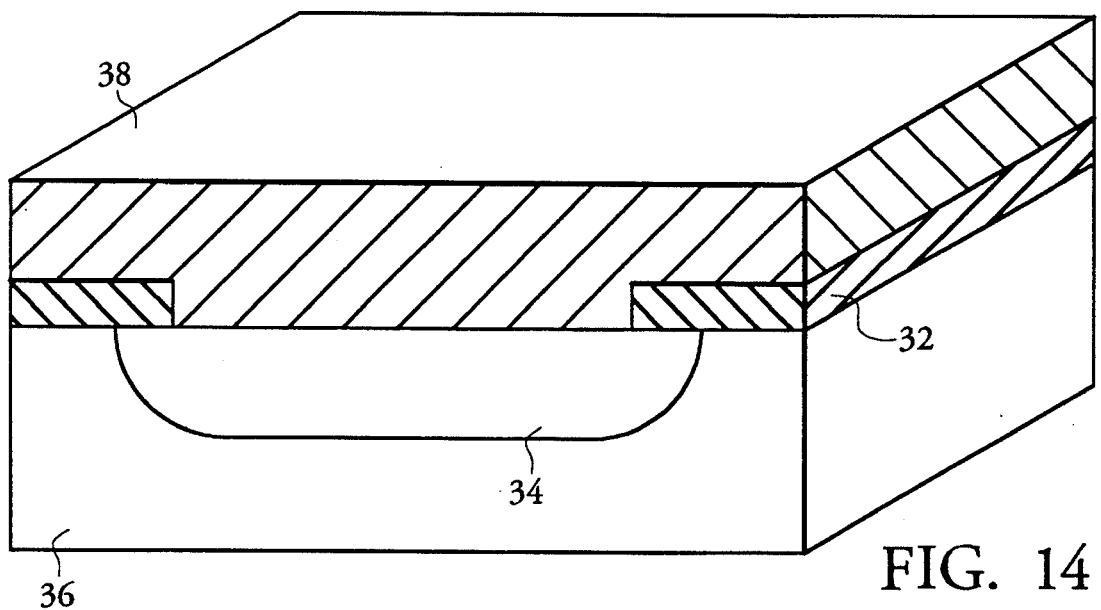
FIG. 14 shows the contact hole of FIG. 13 with an additional blanket layer of tungsten.
Figure 15:
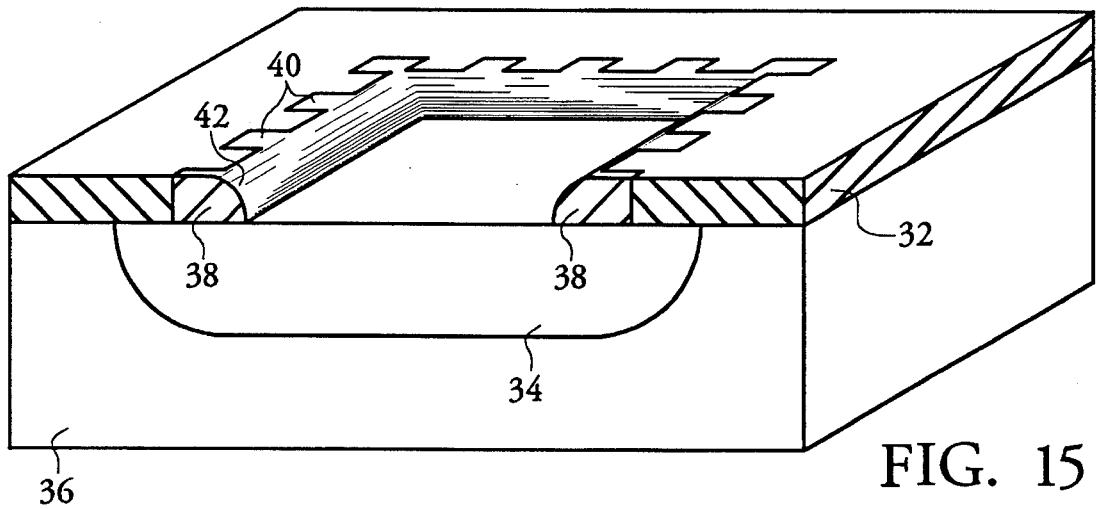
FIG. 15 is a perspective view of a contact showing residue stringers attached to a contact hole sidewall by means of grooves in accord with the present invention.

With reference to FIG. 13, contact hole 44 is made within an insulator material 32 above an active region 34 in a substrate body 36. The outer perimeter of contact hole 44 is patterned to form outwardly protruding grooves cutting into the insulator material 34 away from the contact hole's center area. In this fashion, the perimeter of contact hole 44 is said to form the contour of a battlement that is found atop the walls of medieval fortresses. As illustrated in FIG. 14, a conductive material, preferably tungsten 38, is then laid over the insulator material 32 and within the contact hole over the active region 34, which fills in the inner cavity of the contact hole as well as the patterned groove area. The tungsten 38 is then etched back, thereby filling in the groove areas 40 and forming a stringer 42 along the inner perimeter of the contact hole against the sidewalls of the insulator 32, as shown in FIG. 15. The grooves 40 increase the surface area of the contact hole's sidewall. The larger surface area, in turn, increases adhesion of the stringer 42 to the sidewalls. Additionally, the grooves 40 help to distribute any stress on the stringer 42 to its outreaching grooves 40, which allows the stringer 42 to withstand higher levels of stress.

With reference to FIG. 16, two possible groove patterns in accord with the present invention are shown; along a contact perimeter and another, 39, with a one, 41, with an irregularly distributed groove pattern regularly distributed groove pattern. The groove pattern laid along the contact perimeter is not crucial to the invention, but preferably the groove pattern is made to have a dimension equal to a minimum contact dimension in at least one laterally extending direction X or Y. This assures good step coverage into the groove areas of the contact which further strengthens adhesion of a stringer to a contact window's sidewalls. The minimum contact dimension is determined by the minimum resolution capability of a patterning technology used in the construction of the integrated circuit on which the contact is made.

Figure 17:
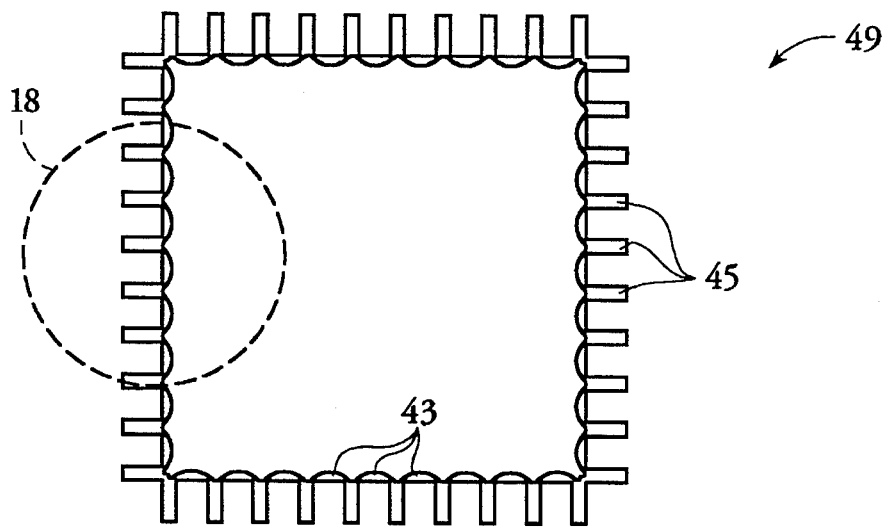
FIG. 17 is a top view of a contact in accord with the preferred embodiment of the present invention.

With reference to FIG. 17, a top view of a contact 49 having a rectangular wall arrangement in accord with the preferred embodiment is shown to have a tungsten stringer 43 attached to the contact's sidewalls. The contact 49 has a rectilinear notch pattern 45 uniformly distributed along the entirety of its perimeter.

Figure 18:
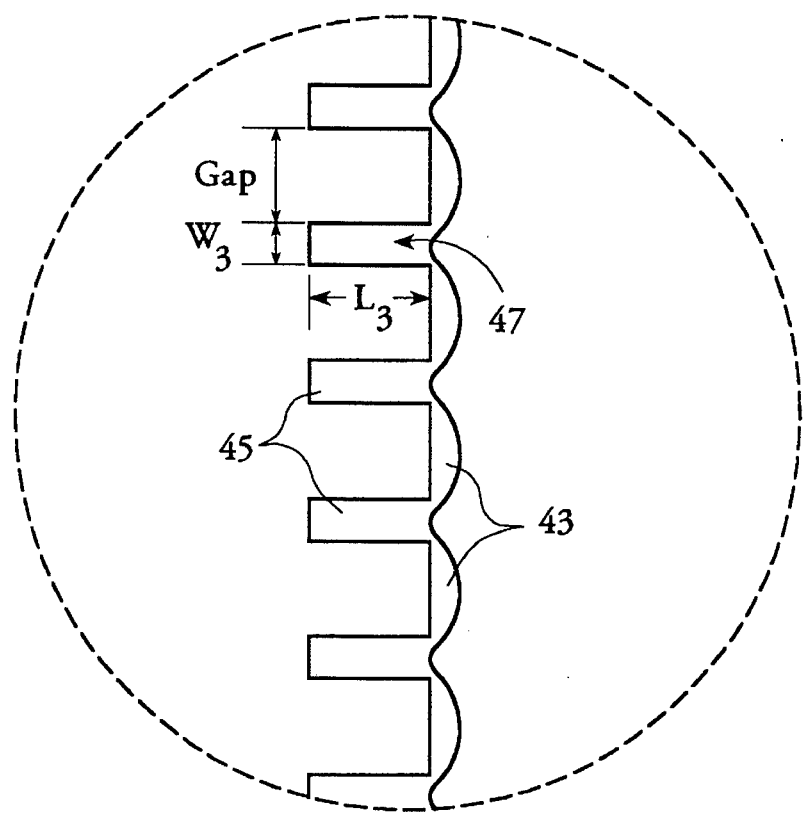
FIG. 18 is a close up view of a sidewall of the contact of FIG. 17.

With reference to FIG. 18, the rectilinear notches 45 have a width, W3, a length, L3 and are separated by a distance GAP. The width W3 is made to be equal to a minimum contact dimension, allowing the tungsten 43 to form good step coverage in the notch area 47. Preferably, the GAP separating adjacent notches 45 is made to be equal to two to ten times the width W3 of a notch 45, and the length L3 is made greater than four times the minimum contact size, thereby allowing for good adhesion area and stress distribution capabilities.

We claim:

1. A semiconductor contact structure comprising;
a semiconductor body having a multi-tier structure including a substrate and a film layer, each of which has opposed major surfaces, with an opposed major surface of said substrate disposed adjacent to an opposed major surface of said film layer, with said substrate having an active area, said body including a via extending from said active area terminating in an aperture disposed in an opposed major surface of said film layer positioned opposite to said substrate, said via having a patterned perimeter disposed about an axis, said axis extending orthogonally to said opposed major surfaces, said patterned perimeter having a plurality of spaced-apart grooved protrusions extending outwardly from said axis.

2. The semiconductor contact structure of claim 1 wherein a spacing between a first pair of said grooved protrusions differs from a spacing between a second pair of said grooved protrusions.

3. The semiconductor contact structure of claim 1 wherein said grooved protrusions are distributed along said patterned perimeter at regular intervals.

4. The semiconductor contact structure of claim 3 wherein said regular intervals are two to ten times a width dimension of said grooved protrusions.

5. The semiconductor contact structure of claim 1 further having perimeter side dimensions greater than 1 μm.

6. The semiconductor contact structure of claim 1 wherein said grooved protrusions have a rectilinear shape having a width generally parallel to said patterned perimeter and a length generally orthogonal to the said patterned parameter.

7. The semiconductor contact structure of claim 6 wherein said width has a dimension between 0.2 μm and 1.0 μm.

8. A semiconductor contact structure comprising;
a semiconductor body having a substrate and film layers joined by at least one via having rectangular sidewalls defining a patterned perimeter with grooved protrusions extending outwardly from said sidewalls forming a contour of a battlement, thereby increasing a surface area of said sidewalls, with said substrate including an active area and said via extending from said active area terminating in an aperture disposed in said film layers.

9. The semiconductor contact structure of claim 8 wherein said grooved protrusions are uniformly distributed along said patterned perimeter.

10. The semiconductor contact structure of claim 8 wherein a spacing between a first pair of said grooved protrusions differs from a spacing between a second pair of said grooved protrusions.

11. The semiconductor contact structure of claim 8 wherein said grooved protrusions have a rectilinear shape having a width generally parallel to said patterned perimeter and a length generally orthogonal to said patterned perimeter.

12. The semiconductor contact structure of claim 11 wherein said grooved protrusions are distributed along said patterned perimeter at regular intervals, with a distance between any two grooved protrusions being in the range of two to ten times the size of said width.

13. A semiconductor contact structure comprising;
a semiconductor body having a multi-tier structure including a substrate and a film layer, joined by a via having a center area and sidewalls having a patterned perimeter, said patterned perimeter having protrusions extending outwardly from said center area, with a stringer being disposed in said via, said stringer having first and second opposed edges, said first edge having a profile matching a profile of said patterned perimeter, with a uniform shape being associated along an entire length of said second edge.

14. The semiconductor contact structure of claim 13 wherein a spacing between a first pair of said grooved protrusions differs from a spacing between a second pair of said grooved protrusions.

15. The semiconductor contact structure of claim 13 further including perimeter side dimensions greater than 1 μm.

16. The semiconductor contact structure of claim 13 wherein said grooved protrusions are distributed along said patterned perimeter at regular intervals.

17. The semiconductor contact structure of claim 13 wherein a spacing between a first pair of said grooved protrusions differs from a spacing between a second pair of said grooved protrusions.

18. The semiconductor contact structure of claim 13 wherein said grooved protrusions have rectilinear shape with a width generally parallel to said patterned perimeter and a length generally orthogonal to said patterned perimeter.

19. The semiconductor contact structure of claim 18 wherein said grooved protrusions are distributed along said patterned perimeter at regular intervals with a distance between any two grooved protrusions being in the range of two to ten times the size of said width.

20. The semiconductor contact structure of claim 13 wherein said via has rectangular sidewalls defining a patterned perimeter having grooved protrusions extending outwardly from said sidewalls forming a pattern of a battlement, thereby increasing a surface said grooved protrusions extend outwardly from said center sidewalls forming a pattern of a battlement, thereby increasing a surface area of said sidewalls.

* * * * *